United States Patent
Halpin

(10) Patent No.: US 6,869,485 B2
(45) Date of Patent: **\*Mar. 22, 2005**

(54) COMPACT PROCESS CHAMBER FOR IMPROVED PROCESS UNIFORMITY

(75) Inventor: Michael W. Halpin, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 263 days.

This patent is subject to a terminal disclaimer.

(21) Appl. No.: 10/210,717

(22) Filed: Jul. 31, 2002

(65) Prior Publication Data

US 2002/0185062 A1 Dec. 12, 2002

Related U.S. Application Data

(63) Continuation of application No. 09/640,604, filed on Aug. 17, 2000, now Pat. No. 6,454,863, which is a continuation of application No. 09/195,793, filed on Nov. 19, 1998, now Pat. No. 6,143,079.

(51) Int. Cl.⁷ ............................................. C23C 16/00
(52) U.S. Cl. ..................... 118/725; 118/715; 392/416; 392/418
(58) Field of Search ............................. 118/620, 641, 118/715, 725, 728, 729; 392/416, 418; 219/390

(56) References Cited

U.S. PATENT DOCUMENTS

| | | | |
|---|---|---|---|
| 4,540,466 A | 9/1985 | Nishizawa | 156/643 |
| 4,558,660 A | 12/1985 | Nishizawa et al. | 118/725 |
| 4,793,283 A | 12/1988 | Sarkozy | 118/725 |
| 4,821,674 A | 4/1989 | DeBoer et al. | 118/666 |
| 4,846,102 A | 7/1989 | Ozias | 118/730 |
| 4,920,918 A | 5/1990 | Adams et al. | 118/724 |
| 4,958,061 A | 9/1990 | Wakabayashi et al. | 219/411 |
| 5,033,407 A | 7/1991 | Mizuno et al. | 118/725 |
| 5,085,887 A | 2/1992 | Adams et al. | 427/55 |
| 5,108,792 A | 4/1992 | Anderson et al. | 427/248.1 |
| 5,221,556 A | 6/1993 | Hawkins et al. | 427/255 |
| 5,250,323 A | 10/1993 | Miyazaki | 427/255.1 |
| 5,269,847 A | 12/1993 | Anderson et al. | 118/715 |
| 5,532,457 A | 7/1996 | Cobb et al. | 219/411 |
| 5,573,566 A | 11/1996 | Anderberg et al. | 65/102 |
| 5,582,866 A | 12/1996 | White | 427/248.1 |
| 5,641,358 A | 6/1997 | Stewart | 118/715 |
| 5,792,273 A | 8/1998 | Ries et al. | 118/715 |
| 5,819,434 A | 10/1998 | Herchen et al. | 34/232 |

(List continued on next page.)

FOREIGN PATENT DOCUMENTS

| | | |
|---|---|---|
| JP | 60-161618 | 8/1985 |
| WO | W/O 99/07925 | 2/1999 |

OTHER PUBLICATIONS

Webster's New Collegiate Dictionary, Merriam–Webster, pp. 895–896, 1975.

Primary Examiner—Jeffrie R. Lund
(74) Attorney, Agent, or Firm—Knobbe Martens Olson & Bear, LLP

(57) ABSTRACT

A semiconductor processing chamber, capable of withstanding low pressures while transmitting radiant energy, is provided in a lightweight, compact design. The inner surface of the window is preferably substantially flat and parallel to the wafer to be processed. The window is thin in a center portion and thicker in a surrounding peripheral portion. The thickness increases in the radially outward direction, defined between the flat inner surface and a concave outer surface. Deposition uniformity is improved by employing multiple outlet ports for distributing gas laterally in a short length, enabling a compact, symmetrical geometry. Preferably, a quadra-flow system of gas distribution is used, whereby the chamber contains one inlet port and three outlet ports distributed approximately at 90 degrees around a cylindrical side wall defining the chamber space.

13 Claims, 4 Drawing Sheets

U.S. PATENT DOCUMENTS

| | | | |
|---|---|---|---|
| 6,021,152 A | 2/2000 | Olsen et al. | 372/99 |
| 6,029,602 A | 2/2000 | Bhatnagar | 118/723 ME |
| 6,099,648 A | 8/2000 | Anderson | 118/715 |
| 6,143,079 A * | 11/2000 | Halpin | 118/715 |
| 6,159,297 A | 12/2000 | Herchen et al. | 118/708 |
| 6,290,806 B1 | 9/2001 | Donohoe | 156/345 |
| 6,454,863 B1 * | 9/2002 | Halpin | 118/725 |
| 6,454,865 B1 * | 9/2002 | Goodman et al. | 118/728 |
| 2002/0185062 A1 * | 12/2002 | Halpin | 118/50.1 |

* cited by examiner

COMPACT PROCESS CHAMBER FOR IMPROVED PROCESS UNIFORMITY

RELATED APPLICATION

This application is a continuation of U.S. patent application Ser. No. 09/640,604, filed Aug. 17, 2000, now U.S. Pat. No. 6,454,863, which is a continuation of U.S. patent application Ser. No. 09/195,793, filed Nov. 19, 1998, now U.S. Pat. No. 6,143,079, both of which are hereby incorporated by reference herein in their entirety and made a part of this specification.

BACKGROUND OF THE INVENTION

1. Field of the Invention

This invention relates to process chambers for chemical vapor deposition and other processing of semiconductor wafers and the like. More particularly, the present invention relates to cold wall process chambers capable of withstanding stresses associated with high temperature, low pressure processes and having improved temperature uniformity and gas flow characteristics.

2. Description of the Related Art

Process chambers for thermally processing semiconductor wafers such as silicon can desirably be made of quartz (vitreous silica) or similar materials which are substantially transparent to radiant energy. Reactors incorporating radiant heat lamps and reaction or process chambers with transparent walls are known in the industry as "cold wall" reactors. Thus, radiant heat lamps may be positioned adjacent the exterior of the chamber and a wafer being processed in the chamber can be heated to elevated temperatures without having the chamber walls heated to the same level. Quartz is also desirable because it can withstand very high temperatures, and because it is inert, i.e., does not react with the various processing gases typically used in semiconductor processing.

Conventional quartz windows used in semiconductor processing chambers generally employ either a flat or outwardly curved configuration. Flat windows are more commonly used when the pressure on the inside of the chamber is substantially the same as the pressure on the outside of the chamber. Flat windows have the advantage of providing a uniform height between the wafer and the inside surface of the window to provide for uniform cross-sections along the flow path of process gases in chemical vapor deposition (CVD), and hence a more laminar flow. Flatwall chambers may also be used when the external pressure outside the chamber differs significantly from the internal pressure within the chamber. However, in such a chamber the windows must be very thick to resist the stresses on the chamber. Thick flatwall chambers unfortunately require additional material and thus add weight to the reactor.

Cold wall chamber designs must also account for thermal effects. In general, the wall temperature during thermal processing should be confined to a very small window. If the temperature gets too high, processing gases can react with one another at the wall (e.g. chemical vapor deposition occurs on the chamber walls). Too low a temperature can cause condensation of constituent gases. In either case, clouding of the walls can cause absorption of radiant heat, leading to cracking and catastrophic failure.

A typical cold wall processing chamber contains a susceptor for supporting the wafer to be processed. This susceptor is often made of a heat absorbing material, which causes the center of the chamber to run extremely hot. When the windows of the chamber are made thick to handle high or low pressure applications, the quartz windows absorb more heat from the inside of the chamber. Additionally, a greater amount of radiant heat is absorbed when passing through thicker transparent walls. Moreover, hotter inner surfaces tend to expand more rapidly than the outer surfaces due to thermal expansion, thereby causing the window to crack.

Forced air cooling is typically applied to the outside of the windows to keep the chamber walls cool during processing. But thick, more massive windows retain more heat, such that forced air cooling is less effective for thick windows. The high temperature at the inner surface of the windows therefore results in chemical deposition on this surface. In addition, it is difficult to direct an appropriate amount of cooling air to a specific location without affecting an adjacent location. Thus, it is difficult to control wall temperature in a desired location to minimize the occurrence of localized depositions.

For applications in which the pressure within a quartz chamber is to be reduced much lower than the surrounding ambient pressure, the strength of the chamber walls becomes important. Dome-shaped chambers have been disclosed, for example, in U.S. Pat. Nos. 5,085,887 and 5,108,792. U.S. Pat. No. 5,085,887 discloses a chamber which includes an upper wall having a convex outer surface and a concave inner surface. A greatly thickened peripheral flange is provided to radially confine the upper wall, causing the wall to bow outward due to thermal expansion, helping to resist the exterior ambient pressure in vacuum applications. The chamber requires a complex mechanism for clamping the thickened exterior flanges of the upper and lower chamber walls.

A lenticular chamber has been described in a pending application entitled PROCESS CHAMBER WITH INNER SUPPORT, Ser. No. 08/637,616, filed Apr. 25, 1996, the disclosure of which is incorporated by reference. This chamber has thin upper and lower curved walls having a convex exterior surface and a concave interior surface in the lateral dimension, with constant longitudinal cross-sections (longitude being defined by the axis internal of gas flow). These walls are joined at their side edges by side rails, thus giving the chamber a generally flattened or ellipsoidal cross-section. The chamber upper and lower walls are generally rectangular in shape, such that a wafer disposed within the chamber is located farther from the upstream and downstream ends than from the lateral side rails.

The rectangular shape of the lenticular chambers is advantageous in keeping elastomeric O-rings located at the longitudinal ends of the chamber farther away from the center of the chamber where the wafer is located. These O-rings have a tendency to heat up, and therefore, if located too close to the susceptor/wafer combination at the center of the chamber, they will become difficult to cool and may burn more easily due to exposure to high temperatures. Moreover, a rectangular shape evenly distributes gas flow through the chamber. By providing a longer longitudinal distance for gas to flow over the wafer to be processed, the gas can spread out in the chamber before reaching the wafer, thereby allowing a more uniform deposition.

While these lenticular chambers present a good design for low pressure applications, scaling this design to larger sizes presents difficulties. A lenticular chamber designed to accommodate a 200 mm wafer has a length of about 600 mm, a width of about 325 mm, and a chamber height of about 115 mm. To increase the chamber size for a 300 mm wafer, while maintaining relatively the same rectangular proportions, the chamber would have to have a length of about 900 mm and a width of about 488 mm. Such a chamber is big and heavy, and more difficult to fabricate, requiring special cranes and lifting devices. The increased footprint also decreases the amount of clean room space available. Furthermore, the larger size makes the chamber more difficult to clean.

Lenticularly-shaped chambers could also be improved to favor a more uniform deposition of material. In such chambers, the quartz wall disposed over the wafer to be processed is curved, creating a greater chamber volume above the center of the wafer than over the lateral edges, such that uniform deposition is difficult to achieve.

Deposition uniformity is affected by the gas flow profile produced over the wafer, both in lenticular and other types of chambers. There have been attempts to control the gas flow profile in parallel across the wafer to be processed, to create a more uniform deposition. For example U.S. Pat. No. 5,221,556 discloses a system in which the apertures of the gas inlet manifold are varied in size to allow relatively more gas through a particular section, typically the center section. U.S. Pat. No. 5,269,847 includes valves for adjustment of pairs of gas flows merging into a number of independent streams distributed laterally upstream of the wafer to be processed. This system emphasizes the importance of channeling the various gas flows separately until just before the wafer leading edge in order to prevent premature mixing and enable greater control over the flow and concentration profiles of reactant and carrier gases across the wafer.

Despite recent advancements, a need still exists for a processing chamber with an improved design. Preferably, such a chamber should exhibit uniform deposition. At the same time, the chamber should be lightweight and compact, but still able to withstand pressure differentials and high temperatures, particularly for wafers 300 mm and larger. Furthermore, this chamber should be made lightweight and strong without subjecting the chamber to depositions or cracking due to thermal effects.

SUMMARY OF THE INVENTION

A semiconductor processing chamber is provided for use at either low or ambient pressures with a compact size which runs cleaner and produces a more uniform deposition profile than the chambers of the prior art. The inner surface of the window is preferably substantially flat and parallel to the wafer to be processed, creating a uniform space above the wafer to lead to a more even deposition of material. The window is thin in a center portion and increases in thickness as determined by an outer surface having a substantially concave shape. Deposition uniformity is improved by employing multiple outlet ports for distributing gas throughout the chamber. Preferably, the reactor employs a multiple-port system of gas distribution. In the disclosed embodiment, the chamber contains one inlet port and three outlet ports distributed approximately at 90 degrees around a cylindrical side wall defining the chamber space.

In accordance with one aspect of the present invention, a single substrate thermal processing chamber is provided with a first wall and a second wall. The first wall is substantially transparent to radiant heat, having a center portion which is thinner than a peripheral portion surrounding the center portion. The second wall similarly includes a thin center portion. A side wall connects the first and second walls to define a chamber space surrounded by the walls. A substrate support structure is positioned within the chamber space.

In accordance with another aspect of the present invention, a chamber is provided with a window which allows transmission of radiant heat to a substrate supported within the chamber. The window has a center portion and a thicker surrounding peripheral portion.

In accordance with another aspect of the present invention, a reduced pressure chamber for processing a semiconductor wafer is disclosed. This chamber includes a window allowing transmission of radiant heat therethrough to a wafer to be processed. The window has inner and outer surfaces for facing the wafer and a radiant heat source, respectively, during processing. The outer surface includes a concavely shaped section.

In accordance with another aspect of the present invention, a cold wall thermal processing reactor is provided. The reactor includes at least one radiant heat lamp, a substrate support structure, and a window disposed between the radiant heat lamp and the substrate support structure. The window has a center portion and a peripheral portion, both of which allow transmission of radiant heat from the lamp to the substrate support structure. The center portion is thinner than the peripheral portion.

In accordance with another aspect of the present invention, a semiconductor processing chamber is provided. The chamber walls define a deposition chamber, and a substrate support is positioned within the chamber for horizontally supporting a single semiconductor substrate. A gas inlet is disposed in the walls of the chamber for producing gas flow into the chamber. At least two gas outlets are disposed in the walls of the chamber for exhausting gas flow from the chamber.

In accordance with another aspect of the present invention, a gas system for processing semiconductor wafers is provided. The system includes a chamber having an upstream end and a downstream end, with an inlet port located at the upstream end of the chamber for releasing processing gases into the chamber. A primary outlet port is located at the downstream end of the chamber for removing processing gases from the chamber to produce gas flow in a longitudinal direction across the wafer. A pair of secondary outlet ports is located in a sidewall connecting the upstream and downstream ends for removing processing gases from the chamber.

In the preferred embodiment, the secondary outlet ports are positioned and configured to minimize gas recirculation within the chamber. Such recirculation can cause process non-uniformity and chamber coatings which affect the overall cleanliness of current state-of-the-art systems.

In accordance with another aspect of the present invention, a cold wall processing reactor is provided with a window between a plurality of radiant heat lamps and a susceptor designed to hold a semiconductor wafer. The window has an inner surface facing the susceptor and an outer surface facing the heat lamps. The window includes a first portion, which is relatively close to a center axis of the susceptor, and second portion, which is farther from a center axis of the susceptor. The minimum thickness of the first portion is smaller than the minimum thickness in the second portion.

In accordance with another aspect of the present invention, a method is provided for producing a uniform gas flow across a semiconductor wafer being processed in a reaction chamber. This method includes tuning the gas flow out of the chamber through a plurality of outlet ports.

DETAILED DESCRIPTION OF THE PREFERRED EMBODIMENT

Although the chamber described herein is applicable to batch processing systems, it is of particular utility in single wafer processing systems. In particular, the chamber 10 described herein is applicable to processing of a single 300 mm silicon wafer at a reduced pressure of about 20 to 60 Torr. It should be recognized, however, that the principles of the present invention are applicable to other size wafers processed at different pressures and temperatures. The skilled artisan may also find application for the principles disclosed herein to both cold wall and hot wall reactors. Furthermore, advantages of the chamber described herein are applicable to several types of processing, including thermal annealing, deposition, etching, lithography, diffusion, and implantation.

Preferred Chamber

Figure 1:
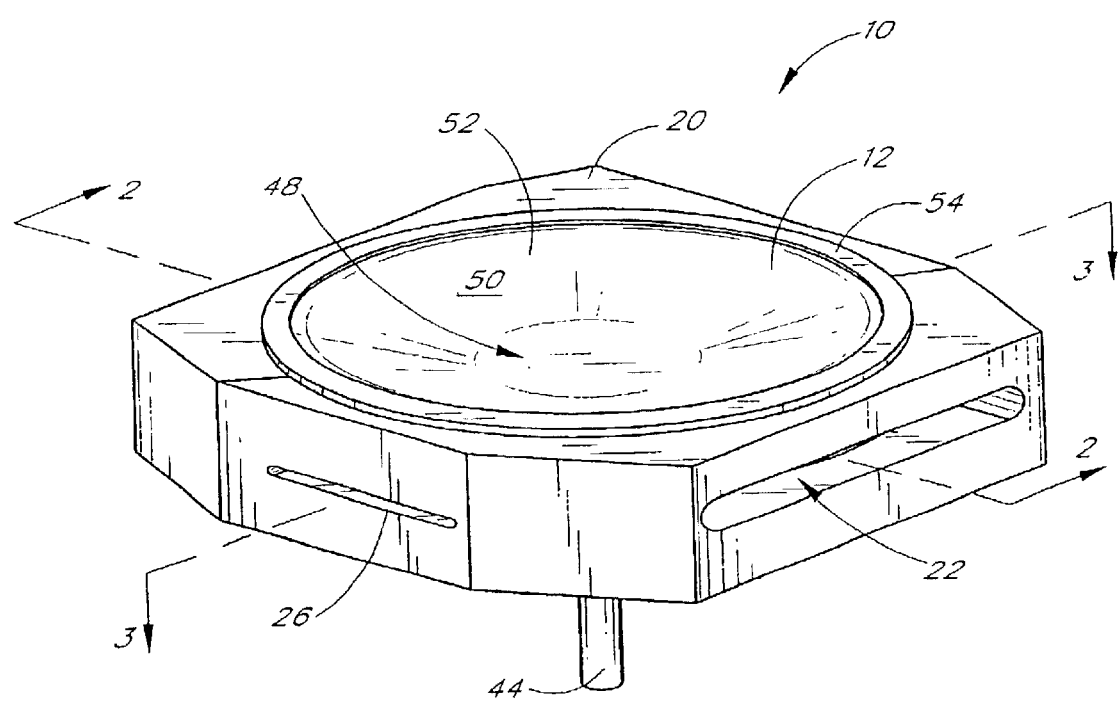
FIG. 1 is a front, top and side perspective view of a processing chamber constructed in accordance with a preferred embodiment of the present invention.
Figure 2:
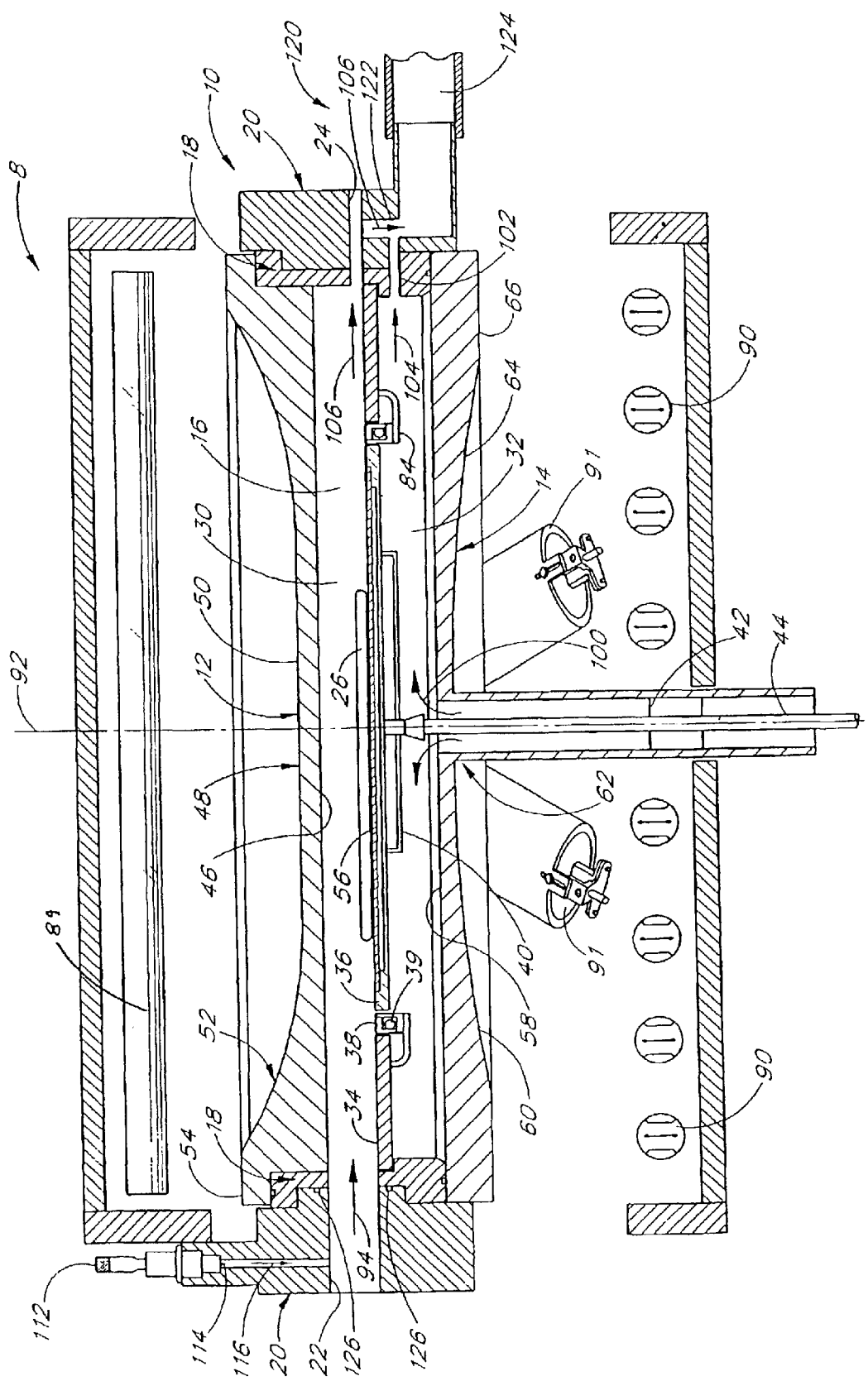
FIG. 2 is a side sectional view along lines 2—2 of FIG. 1.

FIGS. 1 and 2 show a semiconductor processing reactor 8, which includes a reaction or process chamber 10, constructed in accordance with a preferred embodiment. The chamber 10 has an upper wall 12 and a lower wall 14 defining a chamber space 16 between the two. The upper and lower walls 12, 14 are connected by a side wall 18 surrounding the chamber space 16. A flange 20 further surrounds the side wall 18.

As described in further detail below, a system of multiple gas ports is provided in the chamber. The illustrated embodiment shows an inlet port 22, a primary or main outlet port 24, a first side outlet port 26, and a second side outlet port 28 (shown in FIG. 3), provided through the flange 20 and side wall 18 to allow entry and exhaust of processing gases to and from chamber space 16. The inlet 22 is also sized to allow entry and removal of a semiconductor wafer 56. The primary direction of gas flow defines a longitudinal direction, extending from an upstream to a downstream end, where the upstream end corresponds to the location of the gas inlet port 22, and the downstream end corresponds to the location of the main gas outlet port 24, positioned opposite the inlet port 22. A lateral direction is oriented perpendicular to the longitudinal direction. The illustrated side ports 26 and 28 are located in the side wall 18, opposite each other and approximately 90 degrees from the inlet and outlet ports 22 and 24, respectively. Thus, in the illustrated embodiment, the lateral direction extends from the first side outlet port 26 to the second side outlet port 28.

Preferably, at least portions of the upper wall 12 and the lower wall 14 are transparent to radiant heat energy, and preferably comprise quartz. The transparent portions of the walls 12, 14 through which radiant energy actually passes during processing can be referred to as "windows." Although quartz is the preferred material for the upper and lower windows, other materials having similar desirable characteristics may be substituted. Some of these desirable characteristics include a high melting point, the ability to withstand large and rapid temperature changes, chemical inertness and high transparency to radiant heat.

As shown in FIG. 2, the chamber forms part of a reactor 8. A plurality of radiant heat sources are supported outside the chamber 10, to provide heat energy to the chamber 10 without appreciable absorption by the quartz chamber walls. While the preferred embodiments are described in the context of a "cold wall" CVD reactor for processing semiconductor wafers, it will be understood that the processing methods described herein will have utility in conjunction with other heating/cooling systems, such as those employing inductive or resistive heating.

The illustrated radiant heat sources comprise an upper heating assembly of elongated tube-type radiant elements 89. The upper heating elements 89 are preferably disposed in spaced-apart parallel relationship and also substantially parallel with the process gas flow path through the underlying reaction chamber 10 as described below. A lower heating assembly comprises similar elongated tube-type radiant heating elements 90 below the reaction chamber 10, preferably oriented transverse to the upper heating elements 89.

Desirably, a portion of the radiant heat is diffusely reflected into the chamber 10 by rough specular plates (not shown) above and below the upper and lower lamps 89, 90, respectively, while some of lamps 89, 90 are backed by curved reflectors (not shown) to direct concentrated heat. Additionally, a plurality of spot lamps 91 supply concentrated heat to the underside of the wafer support structure (described below), to counteract a heat sink effect created by support structures extending through the bottom of the reaction chamber 10 to the relatively colder environs.

Each of the elongated tube type heating elements 89, 90 is preferably a high intensity tungsten filament lamp having a transparent quartz envelope containing a halogen gas, such as iodine. Such lamps produce full-spectrum radiant heat energy transmitted through the walls of the reaction chamber 10 without appreciable absorption. As is known in the art of semiconductor processing equipment, the power of the various lamps 89, 90, 91 can be controlled independently or in grouped zones in response to temperature sensors.

Figure 3:
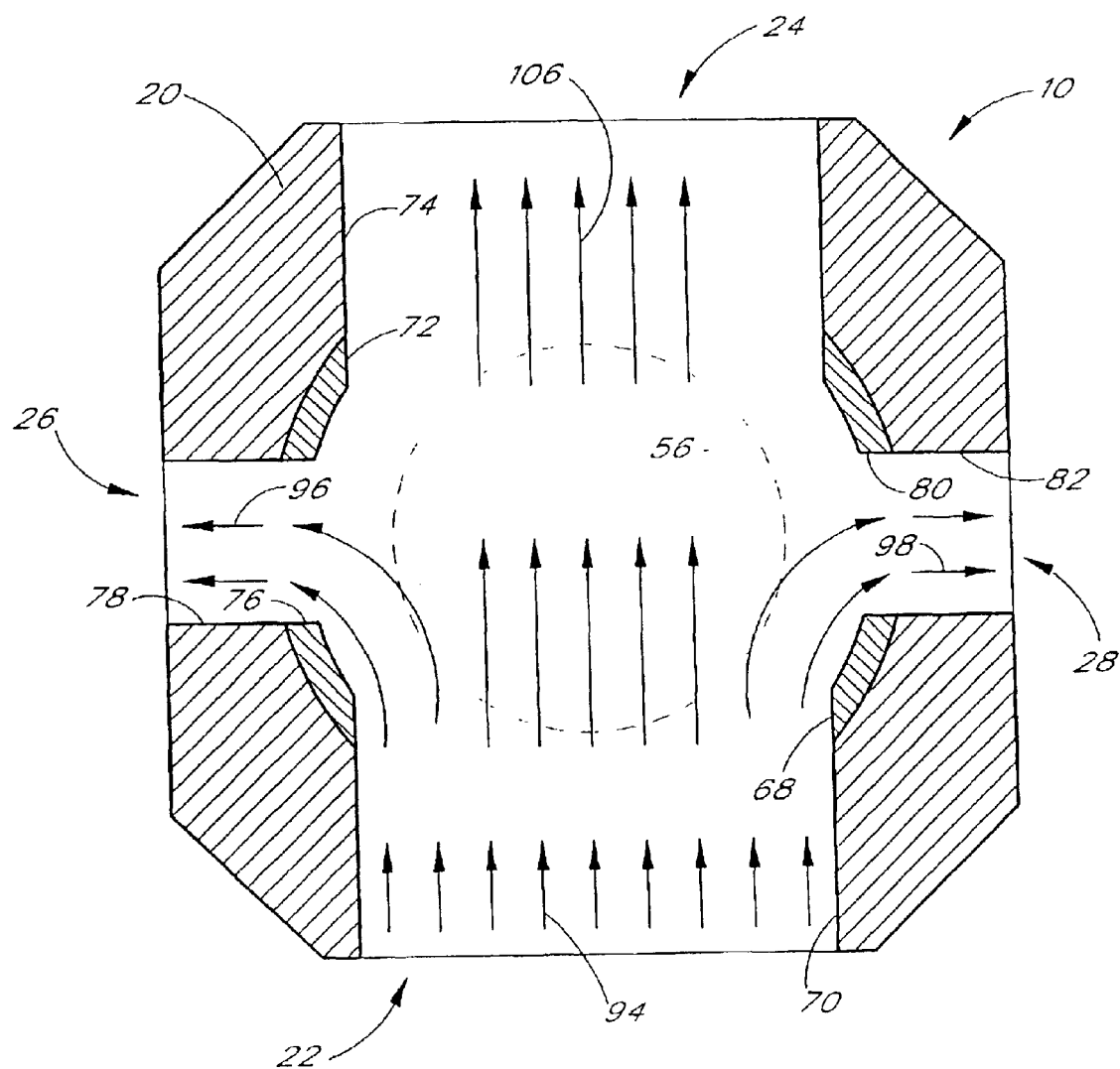
FIG. 3 is a top-down sectional view along lines 3—3 of the processing chamber shown in FIG. 1, illustrating possible gas flow paths through the chamber.

As shown in FIG. 3, the flange 20 defining the horizontal perimeter of the chamber 10 has a generally rectangular shape with chamfered corners. The flange 20 may also be square, circular, or any other shape that will accommodate a compact design for processing a wafer in a small space. The flange 20 is preferably made of 316L stainless steel, and is water cooled during processing in any suitable manner, as will be readily appreciated by one of skill in the art. As shown in FIG. 2, O-rings 126 are provided between the side wall 18 and flange 20. The side wall 18 is preferably made of opaque quartz. Opaque quartz is preferred for the side wall to reflect radiant energy away from the metal flange 20 and back to the chamber, to protect the flange 20 and the O-rings 126 from extreme temperatures.

For a wafer 56 having a diameter of about 300 mm processed at a pressure of about 20 torr, the chamber 10 has a length in the longitudinal direction, as measured from the ends of flange 20, preferably of about 15 to 30 inches, and more preferably about 23 inches. The width of flange 20 in the lateral direction is preferably about 15 to 30 inches, and more preferably about 22 inches. The height of flange 20 is preferably between about 3 to 6 inches, and more preferably, about 4 inches. The inner diameter of the flange 20, corresponding to the outer diameter of side wall 18, is preferably about 14 to 22 inches, and more preferably, about 18 inches. The side wall 18 has an inner diameter preferably of about 12 to 21 inches, and more preferably, about 16.75 inches. The height of side wall 18 is preferably about 2 to 5 inches, and more preferably, about 3.25 inches.

The preferred embodiment thus enables processing a single 300 mm wafer with a small reactor 8 footprint. In the illustrated embodiment, the outer dimensions of the flange 20 define a footprint of less than about 3,300 cm$^2$, whereas the process chamber area, defined by the inner boundaries of the side wall 18, is less than about 1,500 cm$^2$. Despite the compact size and design which avoids recirculation, the novel chamber design enables reduced or low pressure processing, preferably at less than about 100 Torr, and more preferably less than about 60 Torr.

Wafer Support Structure

As shown in FIG. 2, the chamber 10 is divided into an upper section 30 and a lower section 32 by a wafer support structure which comprises a generally flat circular susceptor or wafer holder 36, which supports the wafer 56. The susceptor 36 is located approximately in the center of the chamber 10, and is surrounded by a ring 38, sometimes referred to as a temperature compensation ring or a slip ring. The slip ring 38 can be used to house thermocouples 39, as illustrated, and also to absorb radiant heat during high temperature processing. This compensates for a tendency toward greater heat loss at the edges of wafer 56, a phenomenon which is known to occur due to a greater concentration of surface area for a given volume near such edges. By minimizing edge losses and the attending radial temperature non-uniformities across the wafer 56, the slip ring 38 reduces the risk of wafer crystallographic slip or other consequences of non-uniform temperatures during processing.

As shown in FIG. 2, the susceptor 36 and slip ring 38 are positioned on a plane just below the inlet and outlet ports 22, 24, 26 and 28. A sacrificial or divider plate 34 is provided surrounding the ring 38, preferably comprising quartz. This plate 34 serves to confine gas flow to the upper section 30, thereby producing better laminar flow. The sacrificial plate 34 has an inner diameter which closely conforms with the outer diameter of the ring 38, and an outer shape which conforms with and desirably abuts against the side wall 18. In this manner, the side wall 18 is protected from devitrification from repeated heating of the reaction chamber 10. This enables the sacrificial plate 34 to be replaced when it devitrifies from repeated heat cycles, while preserving the more expensive side wall 18. The plate 34 is preferably supported by ledges formed in the side wall 18, and is preferably located in the same plane as the susceptor 36. The ring 38, in turn, is supported by brackets 84 extending from the plate 34. Alternatively, the slip ring could be supported by a stand resting on the lower chamber wall, or by ledges extending inwardly from the chamber side walls.

The susceptor 36 is supported by a spider 40 having three arms extending radially outward from a central hub and having upwardly extending projections on the ends of the arms engaging the susceptor. The susceptor 36 may also be provided with one or more recesses (not shown) on its lower surface for receiving the ends of the projections to facilitate centrally positioning the susceptor and forming a coupling with the spider 40 for rotating the susceptor. The spider 40 is mounted on a shaft 42 which extends through the chamber lower wall 14 and also extends through a tube 44 integrally attached to and depending from the lower chamber wall 14. The shaft 42 is connected to a drive motor (not shown) for rotating the shaft 42, the spider 40, and the susceptor 36. Details of a similar arrangement together with a drive mechanism may be seen in U.S. Pat. No. 4,821,674, the disclosure of which is incorporated herein by reference.

The susceptor 36 and preferably the slip ring 38 are made from a material which can withstand high temperature processing. Desirably, this material is one that does not devitrify, is a good absorber of radiant energy, is a reasonably good thermal conductor, has good resistance to thermal shock, and is durable and compatible with the various materials and chemicals used in processing. The illustrated susceptor 36 and slip ring 38 comprise silicon carbide. Other potential materials include boron nitride, silicon nitride, silicon dioxide, aluminum nitride, aluminum oxide, combinations or compounds of these materials, pyrolytic graphite and other similar high temperature ceramic compounds.

Design of the Upper and Lower Chamber Walls

Figure 4:
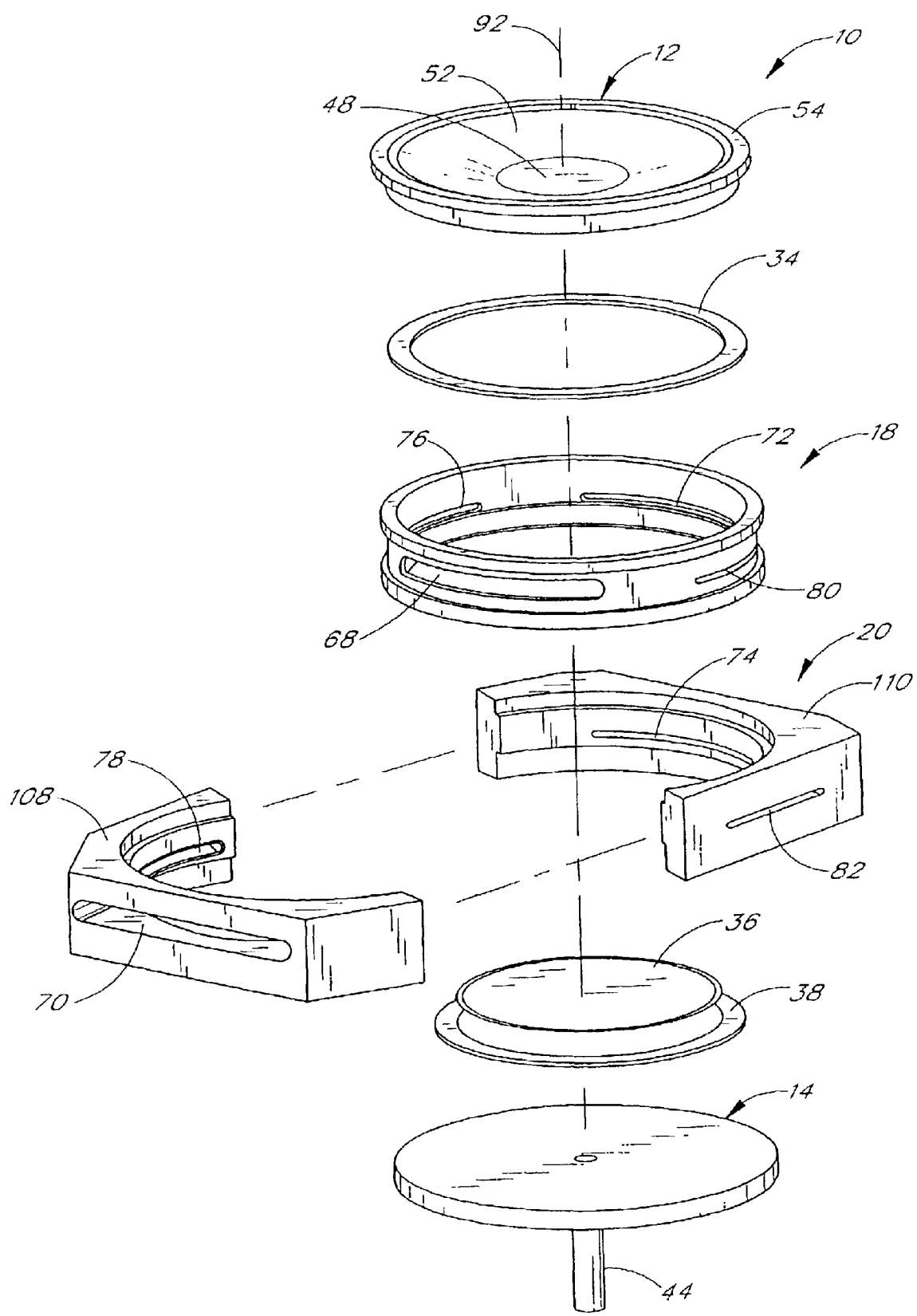
FIG. 4 is an exploded perspective view showing assembly of the processing chamber of FIG. 1.

As shown in FIG. 4, the upper and lower walls 12 and 14 are preferably substantially circular in shape. While in other arrangements, walls of other shapes may also be used, such as rectangles and squares, the round shape advantageously reduces the material costs, weight, and footprint of the reactor 8. Preferably, the wafer 56, as shown in FIG. 3, is substantially circular in shape and is disposed directly below upper wall 12 and above lower wall 14, such that the wafer 56, the upper wall 12, and the lower wall 14 all share a central axis 92, as shown in FIGS. 2 and 4.

Referring to FIG. 2, in the preferred embodiment, the upper wall 12 of chamber 10 has an inner surface 46 which is substantially planar or flat. The planar inner surface 46 of upper wall 12 is substantially parallel to the wafer 56, producing a substantially uniform distance from the upper wall 12 to the wafer 56 and to the divider plate 34. In a center portion 48 of the upper wall 12, an outer surface 50 of chamber 10 is also planar to produce a planar center portion 48 of substantially uniform thickness.

The center portion 48 preferably is circular in shape, but other shapes may be used as well. The center portion 48 is preferably centered along the same central axis 92 as the wafer 56 and the upper and lower walls 12 and 14. Extending outward from the flat center portion 48, the upper wall has a varying thickness. Preferably, the thickness increases outwardly in a peripheral portion or outer ring 52 surrounding the center portion 48 until it reaches the edge 54 of the upper wall 12. At the edge 54 the upper wall 12 has a constant thickness. The center portion 48 is preferably smaller in diameter than the largest wafer for which the chamber 10 is designed (300 mm in the illustrated embodiment), such that the peripheral portion 52 having a greater thickness than the center portion is disposed at least partly above the wafer 56 to be processed. This arrangement enables thermal advantages for the window while allowing structural support for high or low pressure applications. It will be understood, of course, that the same chamber 10 can be utilized to process smaller wafers.

The thickness of the upper wall 12 increases from the perimeter of the thin center portion 48 to the outer edge 54 in thicker peripheral portion 52, as shown in FIG. 2. This increasing thickness preferably gives the upper wall 12 a concave-outward curvature on the outer surface 50 in peripheral portion 52. Unwanted stresses are introduced in curved walls with varying radii and thus, a circular wall with a regular or constant curvature is desirable. In the illustrated embodiment, the thickness of the upper wall 12 in the peripheral portion 52 is defined between the planar inner surface 46 and the outer surface 50 which conforms to a toroidal shape. In other arrangements, however, the thickness may increase in the peripheral portion in accordance with different configurations. For instance, the thickness of the upper wall 12 may gradually increase linearly or by steps. Other configurations include inner or outer surfaces conforming to spherical, toroidal, elliptical, parabolic, and hyperbolic shapes.

Preferably, for a 300 mm (about 11.8 inch) processing chamber, the upper quartz wall 12 has a diameter of about 14 to 22 inches, and more preferably about 18 inches. At the flat center portion 48, the wall 12 preferably has a thickness of about 0.12 inch to 0.35 inch, more preferably about 0.2 inch to 0.3 inches, and is about 0.25 inch in the illustrated embodiment. The diameter of flat center portion 48 is preferably about 6 to 12 inches, and more preferably about 9 inches. The edge 54 has a constant thickness of about 1 to 2 inches, and more preferably, about 1.4 inches, extending over a radial length of about 0.5 to 1.5 inches, more preferably about 0.87 inches. The inner surface 46 of upper wall 12 is preferably about 0.5 to 2 inches above the wafer 56 to be processed, more preferably about 1 inch. The increase in thickness of the upper wall 12 in peripheral portion 52 is determined by the outer surface 50 having a radius of curvature in the vertical dimension of about 5 to 40 inches, more preferably about 8 inches.

As shown in FIG. 2, the lower wall 14 also has a substantially flat or planar inner surface 58 but, unlike the upper wall 12, has a continuously curved concave outer surface 60. This gives the lower wall a center portion 62 which is thinner than a peripheral portion 64. The lower wall 14 has a varying thickness which gradually increases towards an outer edge 66, as preferably determined by the outer surface 60 which has a concave shape with a substantially constant radius of curvature. For the chamber 10 shown in FIG. 2, designed for processing a 300 mm wafer, this radius of curvature is preferably about 20 to 60 inches, more preferably about 40 inches. At the edge 66 the lower wall 14 has a constant thickness. The lower quartz wall 14 preferably has a diameter of about 14 to 22 inches, and more preferably about 18 inches. At the center portion 62 of the wall 14, the minimum thickness can be as described above for the upper wall 12. At the edge 66, the lower wall preferably has a constant thickness of about 0.5 to 1.5 inches, more preferably about 0.88 inches.

The shape of the upper and lower walls 12 and 14, each with an inner surface which is substantially planar and an outer surface with at least a section which is concavely curved, is preferably manufactured by grinding away a center portion of a thick, flat quartz plate. The quartz side wall 18 has a generally cylindrical shape and can be made by cutting a cylindrical tube made of quartz or similar material. Other methods for manufacturing the quartz parts (or other suitable materials) will be readily apparent to those skilled in the art.

Although the chamber 10 shown in FIGS. 1–4 has been described with respect to a certain preferred configuration and certain dimensions, the invention is not intended to be limited to this embodiment. In other arrangements, the upper wall may be shaped as described for the illustrated lower wall 14, and similarly, the lower wall may be shaped as described for the illustrated upper wall 12. Thus, the outer surfaces of either or both the upper and lower walls can be continuously concave in shape, and either or both can have a flattened or planar center portion. Furthermore, the upper and lower walls may simply comprise a center portion which is thinner than a surrounding peripheral portion. Moreover, the lower wall may simply be substantially flat and uniformly thick throughout, while the upper wall has varying thickness. Varying thickness in the upper or lower walls can be determined by a variety of shapes and curvatures, including, but not limited to, spherical, toroidal, elliptical, parabolic, and hyperbolic configurations. Various other combinations of upper wall and lower wall configurations will be readily apparent to the skilled artisan, in light of the present disclosure.

Process Chamber Assembly

Assembly of the process chamber is shown in an exploded perspective view in FIG. 4. More particularly, FIG. 4 shows assembly of the upper wall 12, sacrificial plate 34, side wall 18, flange 20, susceptor 36, slip ring 38, lower wall 14, and tube 44. The flange 20 is comprised of an inlet flange 108 and an outlet flange 110, which are joined around the side wall 18.

In practice, the chamber 10 can be easily assembled and disassembled on site. For example, the inlet flange 108 can be first mounted to the frame of a reactor cabinet. The quartz side wall 18 is then slid into the inlet flange 108 with the elongated slot 68 aligned with the aperture 70 within the flange 108, thus defining the inlet port 22 (see FIGS. 2 and 3). As shown, the side wall 18 includes an annular recess to receive an annular ring extending inwardly from the inlet flange 108.

The outlet flange 110 can then be fitted onto the side wall 18 in a similar fashion, until the outlet flange 110 contacts the inlet flange 108 and can be bolted or otherwise fastened together. The lower wall 14, susceptor support (not shown) and susceptor 36 can then be installed in sequence, and the appropriate joints sealed against process gas leakage. The quartz ring 34 sits on an annular ledge provide on the inner surface of the side wall 18, just below the slots 68, 72, 76, 80. The ring 34, which includes brackets 84 best seen in FIG. 2, supports the slip ring 38 surrounding the susceptor 36. The upper wall 12 is then fitted onto the side wall 18, supported by the outer edge 54 of the wall 12. Exhaust manifolds (not shown) and valves can then be installed to receive effluent gases through the ports 24, 26, 28.

The chamber 10 is thus field assembleable, thereby eliminating the need for expensive welded chambers. Due to the field assembleable feature, the chamber geometry can be changed easily. Thus, different upper and lower walls 12 and 14 may be provided to the chamber to produce different thermal effects and other desired characteristics for the chamber 10. Moreover, the susceptor 36 and sacrificial plate 34 can be quickly and easily replaced by removal of the upper wall 12.

Inlets and Outlets for Improved Gas Flow

The preferred chamber 10 also provides improved gas flow distribution by employing multiple outlet ports. These ports are distributed around the chamber 10 to spread out the flow of processing gases. Preferably, at least some of these outlet ports include variably openable valves to tune the flow out of the chamber 10. Moreover, the outlet ports are preferably symmetrically distributed in the chamber to facilitate uniform, laminar flow and reduce recirculations.

The illustrated chamber 10 of the preferred embodiment includes four gas ports (one inlet 22 and three outlets 24, 26, 28). As shown in FIG. 3, a wafer 56 (shown in phantom) is disposed horizontally in the center of chamber 10. The gas inlet port 22 is provided at the upstream end of the chamber 10. This port 22 allows entry into the chamber 10 of reaction gases as well as the wafer 56. At the downstream end, opposite the inlet port 22, the primary or main outlet port 24 is provided for exhaust of the processing gases. The side ports 26 and 28 are located at the same vertical level as the inlet port 22 and the main outlet port 24. Thus, all four gas ports are positioned at or about a common horizontal plane. Preferably, the side outlet ports 26 and 28 are located approximately 90 degrees from the ports 22 and 24 along the substantially cylindrical side wall 18 of chamber 10, and approximately 180 degrees apart from each other. Accordingly, a line joining the side ports 26 and 28 is approximately transverse to the longitudinal primary flow of processing gases.

Apertures for the inlet and outlet ports are machined into the side wall 18 of the preferred quartz materials. Inlet port 22 is defined by a horizontal elongated slot 68 machined into the side wall 18, which mates with an aperture 70 in flange 20. The slot 68 allows wafer insertion. The slot also permits the introduction of processing gases after an isolation valve (not shown) between the slot 68 and a wafer handling chamber (not shown) has been closed. Similarly, at the three outlet ports 24, 26 and 28, corresponding horizontal slots 72, 76 and 80 are machined into the side wall 18, mating with apertures 74, 78 and 82, respectively, in the flange 20 when the chamber 10 is assembled. Alternatively, the quartz side wall can be molded with apertures. The outlet ports allow exhaust of process gas from the chamber 10, as well as the application of a vacuum to the chamber.

Referring now to FIG. 2, a gas injector 112 is positioned upstream of the process chamber 10 and includes a plurality of reactant gas flow needle valves 114 for controlling the flow of process gases into the chamber through multiple ports. The gas injector may be of a type described in a pending application entitled PROCESS CHAMBER WITH INNER SUPPORT, Ser. No. 08/637,616, filed Apr. 25, 1996, the disclosure of which is incorporated by reference. Gases are metered through the injector 112 in a downward direction indicated by arrow 116, and thereafter passes through the inlet port 22 leading into the upper section 30 of the process chamber 10. Gas flow outside the chamber through the port 22 is prevented by a gate valve or door (not shown). The gate valve is open only during wafer transfer, during which process gases are not flowing. While the illustrated embodiment of FIG. 2 shows the injector 112 extending through the flange 20, it will be understood that, in other arrangements, injectors can be arranged in a separate outside flange which interfaces with the gate valve.

The gas flow into the chamber is indicated by the arrow 94. The gas flow moves generally longitudinally across the wafer 56, primarily due to a decreasing pressure gradient along the chamber in the direction of a vacuum source (not shown) downstream at the outlet port 24 for low pressure applications. It will be understood by one of skill in the art, however, that gas flow can also be maintained in the absence of vacuum pump. At the outlet port 24, an exhaust apparatus 120 is provided for receiving the exhaust gases.

As shown in FIG. 2, at the main outlet port 24, the gas flow communicates with an exhaust conduit 122 according to arrow 106, leading to an exhaust manifold 124 which is attached to a suitable source of vacuum. Alternatively, condensation at a downstream scrubber can assist flow-through of the exhausted gases.

Referring to FIG. 3, gas flow through the outlet ports can be adjusted or tuned through the use of valves (not shown). Preferably, the valves are of a type which can be selectively opened and closed to produce a pressure gradient from the inlet port 22 to these outlet ports, and thereby regulate gas flow. Any suitable adjustable valve means, such as bellows-type, ball valves, butterfly valves, etc., can be employed for this purpose, as will be understood by the skilled artisan. All three exhaust ports 24, 26, 28 are plumbed to a common port from the valves.

In the preferred embodiment, variably adjustable bellows-type valves are disposed at the side outlet ports 26 and 28, but not at the main outlet port 24. Thus, gas flows primarily longitudinally through the chamber, as indicated in FIG. 2 by a gas inlet flow arrow 94 and a gas outlet flow arrow 106. In addition, secondary gas flow branches laterally off the primary gas flow path, as shown by arrows 96 and 98. By tuning valves at these side outlet ports 26, 28, the gas flow can be spread or narrowed within the chamber 10 to provide a better distribution of gases and a more even process treatment. In another embodiment, plates with fixed orifices, optimaly sized for a desired gas flow pattern, are use in place of adjustable valves at the secondary exhaust ports 26, 28.

Processing with this chamber 10 is now described in the context of an exemplary chemical vapor deposition (CVD) process. It will be understood, however, that the preferred chamber will also be advantageous for other non-CVD processing. Initially, process gases enter the chamber 10 at an ambient, non-reacting temperature and are heated to a temperature suitable for deposition as they pass over the susceptor and wafer. The radiant heat lamps 89, 90, 91 heat the wafer 56, either directly or by way of the susceptor and the slip ring. The surrounding slip ring 38 is a high heat absorbency material, allowing the ring to preheat the reactant gas stream before it reaches the leading edge of the susceptor, and subsequently, the leading edge of the wafer. The preheated process gases thus readily react at the wafer surface, which is at the desired reaction temperature.

As shown in FIG. 2, purge gas is supplied upward through the hollow tube 44 surrounding the shaft 42. The purge gas enters the lower portion 32 as indicated by arrows 100. The purge gas inhibits process gases from flowing around the edges of the susceptor 36 into the lower section 32, thus inhibiting unwanted deposition of particulates underneath the susceptor 36. The bulk of this purge gas exits through the lower longitudinal aperture 102 near the outlet port 24 (beneath the plate 34), as indicated by arrow 104. The purge gas then mixes with the spent reaction gas and continues downward through the exhaust conduit 122. Purge gas ports may also be provided below the inlet or other outlet ports provided in the side wall 18.

In the illustrated embodiment, for processing a 300 mm wafer, the inlet port 22 preferably has a length of about 12 to 15 inches, and more preferably about 13.25 inches, and a height preferably of about 0.5 to 1.5 inches, and more preferably, about 1 inch. The main outlet port 24 preferably has a length of about 12 to 15 inches, and more preferably, about 13 inches, and a height preferably of about 0.2 to 1 inch, and more preferably, 1.5 inch. The side outlet ports 26 and 28 each preferably have a length of about 2 to 10 inches, and more preferably, about 5.5 inches, and a height preferably of about 0.2 to 1 inch, and more preferably, about 0.5 inch.

While the invention discussed herein describes a preferred embodiment with one inlet port and three outlet ports located approximately 90 degrees apart, it should be recognized that a gas flow system utilizing fewer or additional ports may be employed without deviating from the essential design of the invention. For example, a "main" gas outlet need not be provided at the downstream end of the chamber. Even for reactors with the disclosed quadra flow structure, the main gas outlet need not handle the majority of the exhaust flow. Chambers with two, four or more outlet ports can be utilized, these ports located at various locations within the chamber to control gas flow. Furthermore, any or all of the outlet ports can be provided with valves or plates with orifices of a fixed size for tuning the distribution of gas flow within the chamber 10.

Reduced Pressure Applications

The chamber 10 designed as described above offers several advantages over previously known processing chambers. First, the chamber utilizes a substantially thin wall configuration while still being able to withstand compressive stresses due to low pressure processing. Finite element analysis shows that a chamber having a thin wall disposed over a wafer to be processed, with an increasing thickness towards an outer edge, will have sufficient strength for reduced pressure processing. A quartz window having a substantially planar inner surface and a substantially concave outer surface has been found to be a particularly strong design. Preferably, the chamber can withstand pressure differentials of greater than 0.5 atm., and more preferably about 1 atm.

In the illustrated preferred embodiment, the upper chamber wall 12 has a uniformly thick center portion 48, and a peripheral portion 52 with greater thickness than in the center portion. This peripheral portion 52 preferably is disposed at least partly above the wafer 56 in order to provide strength to chamber 10 near the center of the chamber. For example, the ratio of the center portion 48 to the diameter of the wafer 56 can be about 0.75. Similarly, the lower wall 14 has a planar inner surface 58 and a concave outer surface 60 to give the wall 14 an increasing thickness from a center portion 62 to an outer edge 66, thereby giving the chamber 10 sufficient strength in the lower wall to withstand compressive stresses due to low pressure processing.

Thermal Effects

During conventional processing of a semiconductor wafer in a cold wall reactor, the walls of a chamber are substantially transparent to radiant heat emitted from the lamps 89, 90, 91, such that radiation will pass through the walls without significant absorption. This radiation then heats the wafer and susceptor disposed inside the chamber. Once heated, the wafer and susceptor will re-radiate energy toward the walls. Because this re-radiated energy is of lower frequency than the IR energy coming directly from the lamps, the quartz windows tend to absorb this re-radiated energy. The thicker the quartz material, the more heat that is retained in the walls. Heating of the walls causes thermal expansion forces which can cause cracking or failure of the walls, particularly where different sections of a wall are heated to different degrees. Furthermore, inadequate control over the temperature of the walls can lead to deposition of reactant gases on the inner surfaces of the walls.

When processing a semiconductor wafer in a chamber with upper and lower walls at high temperatures, the most intense heat is re-radiated from the susceptor and wafer toward the center portions of the upper and lower walls closest to the wafer, while less intense heat is directed toward the peripheral portions of the upper and lower walls. The design of chamber 10 of the present invention accounts for this heat distribution in order to control the temperature of the walls by providing the upper and lower walls 12 and 14 with a thinner center portion and a thicker peripheral portion. Because thinner walls do not retain heat as much as thicker walls, varying the thickness of the walls according to the intensity of heat emitted from the susceptor and wafer can help to control the temperature of the upper and lower walls. Therefore, the upper and lower walls are made thinner in their center where greater heat is directed, and thicker in their periphery where less heat is directed.

The varying thickness of the upper and lower walls enables effective cooling by forced air or liquid cooling. During high temperature processing of a wafer 56, the chamber 10 is provided with cooling air across the outer surfaces 50 and 60 of upper and lower walls 12 and 14, respectively, to cool the inner surfaces 48 and 58. Because heat re-radiated from the wafer and susceptor is more intense at the center portions of the upper and lower walls, these center portions are advantageously made thinner so that the air has a larger effect on cooling the walls. Toward the peripheral portions of the upper and lower walls, by contrast, less heat is re-radiated from the wafer and susceptor, and the walls require less cooling from the air and therefore can be made thicker. It will be understood that quartz walls can also be provided with throughbores running parallel to the wall surfaces, through which cooling liquid can be circulated.

Thus, the chamber 10 of the present invention is preferably designed to have upper and lower walls of varying thickness, where the thicknesses of the walls is determined to provide control over the temperature of the inner surfaces of the walls. This temperature control is of particular utility in reducing chamber wall deposits during chemical vapor deposition (CVD). The walls of chamber 10 would be kept in the correct temperature range to prevent coatings deposited on the inner walls. If the inner surface of the chamber walls gets too hot, deposition can occur by decomposition of reactant gases. For example, silane can decompose and deposit silicon on hot chamber surfaces. If cooled too much, process gas condensation can contaminate the inner wall. For example, silane, trichlorosilane or other silicon source gases can condense upon overly cooled chamber surfaces. Controlling the wall temperature by varying the wall thickness thereby reduces deposition of reactant gases onto the walls and thereby lowers particulate generation in the chamber. The illustrated chamber thus has a longer service life and greater throughput, since the chamber does not have to be cleaned as frequently.

Furthermore, by varying the thickness of the upper and lower walls in order to control wall temperature, these walls can be provided with a controlled temperature both across their inner surfaces and between the inner surfaces and outer surfaces of the walls. Moreover, a substantially uniform temperature across the inner surfaces reduces the occurrence of localized depositions which can affect the distribution of heat within the chamber, and ultimately affect the uniformity of wafer treatment (e.g., thickness of deposition).

Deposition Uniformity and Compact Design

The present invention improves deposition uniformity for low pressure processing of a semiconductor wafer in a chamber having thin walls by the design of the chamber walls. The upper and lower walls 12 and 14 are designed to have inner surfaces 46 and 58, respectively, which are substantially planar. This creates a uniform cross-sectional area over the wafer 16. The uniform chamber height provided over the wafer leads to a more laminar gas flow, which in turn leads to more uniform deposition of reactant material onto the wafer. Moreover, the flat inner surfaces 46, 58 enable confined chamber volumes and faster gas flow rates, leading to faster deposition and greater throughput.

Deposition uniformity is further improved by the multiple outlet port gas system as described above and in particular, the illustrated quadra gas flow system. By providing side gas outlets 26 and 28, in addition to main gas outlet 24, gas distribution within the chamber can be controlled to provide gas flow toward the sides of the chamber where the side outlet ports are located, as well as in a generally downstream direction toward the main outlet port. By tuning adjustable valves in the outlet ports 26 and 28, laminar gas flow can be provided.

Furthermore, by improving gas flow in this manner, the chamber 10 can be made more compact than previously designed chambers because the reactant gases do not require additional space to spread out toward the sides of the chamber before reaching the wafer. The gas flow configuration, by providing multiple gas outlets in the lateral walls of the chamber, provides deposition towards the sides of the wafer without the need for a larger chamber. The chamber 10 can also be made more compact by making the side wall 18 out of opaque quartz in order to protect the O-rings 126 found between the side wall 18 and flange 20. The opaque quartz reflects more heat back to the chamber than would transparent quartz. Therefore, the O-rings can be placed closer to the susceptor and wafer without increasing the risk that the O-rings will heat too much or burn.

Although this invention has been described in terms of certain preferred embodiments, other embodiments that are apparent to those of ordinary skill in the art are also within the scope of this invention. Accordingly, the scope of the invention is intended to be defined by the claims that follow.

What is claimed is:

1. A semiconductor processing chamber, comprising:

a substrate support positioned within the chamber; and a window provided above the substrate support which allows transmission of radiant heat to a substrate positioned on the substrate support, the window having a substantially planar inner surface which spans substantially the entire cross-sectional area of the chamber from an inlet port at a first side of the chamber to an outlet port at an opposite side of the chamber, and an outer surface which is at least partially concavely curved over a substantial portion of the window, the window forming a separation between the inside of the chamber and an ambient environment on the outside of the chamber to prevent process gases from passing therethrough.

2. The semiconductor processing chamber of claim 1, wherein the outer surface includes a center portion and a peripheral portion.

3. The semiconductor processing chamber of claim 2, wherein the center portion of the outer surface is substantially planar and the peripheral portion of the outer surface is concavely curved.

4. The semiconductor processing chamber of claim 2, wherein the center portion and the substrate support are both substantially circular, and the center portion has a diameter that is smaller than the diameter of the substrate support.

5. A processing chamber, comprising:

a first wall having at least a portion thereof which is substantially transparent to radiant heat, the first wall having a center portion of uniform thickness and a peripheral portion surrounding the center portion, the peripheral portion having a thickness dimension larger than that of the center portion, the first wall forming a separation between the inside of the chamber and an ambient environment on the outside of the chamber to prevent process gases from passing therethrough;

a second wall disposed opposite from said first wall and which is substantially aligned with said first wall;

a peripheral wall attached to the first wall and the second wall such that a chamber space is enclosed within the walls; and a substrate support positioned within the chamber space, wherein at least a portion of the peripheral portion having a thickness dimension larger than that of the center portion of the first wall is disposed over the substrate support.

6. The processing chamber of claim 5, wherein the first wall has an inner surface facing said substrate support that is substantially planar.

7. The processing chamber of claim 5, wherein the first wall has an outer surface that is concavely curved in the peripheral portion.

8. The processing chamber of claim 5, wherein the first wall has an outer surface that is substantially planar in the center portion.

9. A semiconductor processing chamber, the chamber having an interior space spanning substantially the entire cross-sectional area of the chamber from an inlet port on a first side of the chamber to an outlet port on an opposite side of the chamber, the chamber comprising a window which allows transmission of radiant heat to a substrate supported within the chamber, the window being a substantially solid member that prevents process gases from passing therethrough, the window having a center portion and a surrounding peripheral portion, wherein the surrounding peripheral portion encloses the center portion in the plane of the window, the peripheral portion having a thickness dimension greater than a thickness dimension of the center portion, wherein the inner surface of the window is substantially planar and spans substantially the entire cross-sectional area of the interior space.

10. The semiconductor processing chamber of claim 9, wherein the window has a varying thickness which gradually increases from the center portion to an outer edge of the peripheral portion.

11. The semiconductor processing chamber of claim 10, wherein the peripheral portion of the window is at least partially concavely curved.

12. The semiconductor processing chamber of claim 9, wherein the center portion of the window has a uniform thickness.

13. The semiconductor processing chamber of claim 12, wherein the center portion has an area that is smaller than the area of the substrate.

\* \* \* \* \*